US008892278B2

(12) United States Patent
Lin et al.

(10) Patent No.: US 8,892,278 B2
(45) Date of Patent: Nov. 18, 2014

(54) OVERHEAD RAIL GUIDED TRANSPORT SYSTEM AND IMPLEMENTATION METHOD THEREOF

(75) Inventors: Huan-Cheng Lin, New Taipei (TW); Chin-Hsiao Chuang, Taipei (TW)

(73) Assignee: Inotera Memories, Inc., Hwa-Ya Technology Park Kueishan, Taoyuan (TW)

( * ) Notice: Subject to any disclaimer, the term of this patent is extended or adjusted under 35 U.S.C. 154(b) by 0 days.

(21) Appl. No.: 13/420,623

(22) Filed: Mar. 15, 2012

(65) Prior Publication Data

US 2013/0138277 A1    May 30, 2013

(30) Foreign Application Priority Data

Nov. 30, 2011    (TW) .............................. 100143999 A

(51) Int. Cl.
*G05D 1/02*    (2006.01)
*H01L 21/67*    (2006.01)
*B65G 47/52*    (2006.01)
*B61B 13/04*    (2006.01)
*E01B 25/22*    (2006.01)
*H01L 21/677*    (2006.01)
*B65G 1/04*    (2006.01)
*B61B 3/00*    (2006.01)

(52) U.S. Cl.
CPC .......... *H01L 21/67733* (2013.01); *B65G 47/52* (2013.01); *B61B 13/04* (2013.01); *E01B 25/22* (2013.01); *H01L 21/67727* (2013.01); *B65G 1/0457* (2013.01); *H01L 21/6773* (2013.01); *B61B 3/00* (2013.01)

USPC .............. 701/19; 701/1; 6/112; 6/113; 6/213; 6/228; 104/89; 104/91; 104/98; 104/124; 104/127; 414/222.01; 414/222.02; 414/222.13; 414/592; 105/144; 105/146; 105/148

(58) Field of Classification Search
CPC ....................................... B65G 37/005
USPC .................................... 700/121, 228
See application file for complete search history.

(56) References Cited

U.S. PATENT DOCUMENTS

| | | | | |
|---|---|---|---|---|
| 3,783,792 | A * | 1/1974 | Cullom | 104/128 |
| 3,789,765 | A * | 2/1974 | Schultz | 104/96 |
| 3,918,367 | A * | 11/1975 | Alimanestianu et al. | 104/127 |
| 4,030,422 | A * | 6/1977 | Pasquan | 104/130.04 |
| 4,207,821 | A * | 6/1980 | Beckert | 104/119 |
| 5,069,140 | A * | 12/1991 | Glassey | 104/28 |
| 5,184,861 | A * | 2/1993 | Voellmer | 294/119.1 |

(Continued)

FOREIGN PATENT DOCUMENTS

| | | |
|---|---|---|
| CN | 101139039 A | 3/2008 |
| JP | 332602 U | 3/1991 |
| TW | I322791 | 4/2010 |

*Primary Examiner* — Fadey Jabr
*Assistant Examiner* — Kevin P Mahne
(74) *Attorney, Agent, or Firm* — Winston Hsu; Scott Margo

(57) ABSTRACT

A method for implementing an overhead rail guided transport system includes the following steps: a vehicle transport system is provided, which includes an upper rail guided transport system, a lower rail guided transport system, a vehicle exchange equipment, and a plurality of vehicles operating in the upper and lower rail guided transport system; respective vehicle utilizing rates in the upper and lower rail guided transport systems are provided; the vehicle exchange equipment is used to interchange the vehicles respectively operating in the upper and lower rail guided transport systems in order to equilibrate the respective vehicle utilizing rates.

18 Claims, 7 Drawing Sheets

(56) References Cited

U.S. PATENT DOCUMENTS

| | | | |
|---|---|---|---|
| 6,240,851 B1* | 6/2001 | Oudakker et al. | 104/127 |
| 6,899,145 B2* | 5/2005 | Aggarwal | 141/11 |
| 7,925,380 B2 | 4/2011 | Yu | |
| 2004/0112245 A1* | 6/2004 | Cortazar | 104/28 |
| 2005/0166785 A1* | 8/2005 | Schramek et al. | 104/91 |
| 2006/0222479 A1* | 10/2006 | Shiwaku et al. | 414/267 |
| 2007/0198333 A1* | 8/2007 | Wang et al. | 705/13 |
| 2008/0014061 A1* | 1/2008 | Izumi | 414/281 |
| 2008/0228310 A1* | 9/2008 | Wang et al. | 700/121 |
| 2009/0114507 A1* | 5/2009 | Kitazumi et al. | 198/370.09 |
| 2010/0074717 A1* | 3/2010 | Huang et al. | 414/222.02 |
| 2011/0024377 A1* | 2/2011 | Yamamoto | 212/71 |
| 2011/0162552 A1* | 7/2011 | Edwards | 104/124 |
| 2012/0114453 A1* | 5/2012 | Ota et al. | 414/281 |
| 2012/0275886 A1* | 11/2012 | Ota | 414/222.08 |

* cited by examiner

_US 8,892,278 B2_

OVERHEAD RAIL GUIDED TRANSPORT SYSTEM AND IMPLEMENTATION METHOD THEREOF

BACKGROUND OF THE INVENTION

1. Field of the Invention

The present invention generally relates to the field of vehicle transport systems, and more particularly to an overhead rail guided transport system having an automatic balancing function and an implementation method thereof.

2. Description of the Prior Art

With the continuous progress of the semiconductor industry, in the development and the design of ultra large scale integrated circuits (ULSI), the size of components have be reduced down to the nanometer degree in order to meet the requirements for designs of high density integrated circuits. Accordingly, there are hundreds of process steps for fabricating the required integrated circuits, such as etching, polishing, diffusion and deposition processes. That is to say, from the beginning to the end of the fabrication process, wafers in a same lot may be repeatedly transported from one to another tool for processing.

At present, in both interbay and intrabay regions, the wafers are transported by the overhead hoist transport system of an automated material handling system (AMHS). The overhead hoist transport system holds front open united pods (FOUPs) full of wafers, and transports the FOUPs among different processing tools along rails. However, there are still many drawbacks in the conventional transport system. For example, since each of the overhead hoist transport system is generally operated independently, the vehicles must be driven to certain maintenance areas and un-loaded by man power if they are to be changed to different overhead hoist transport systems. Also, due to the overhead hoist transport systems being independent, the vehicles can not be equilibrated automatically, which causes limited vehicle utilizing rates and wastes a lot of time during the exchanging steps.

Therefore, there is a need to provide a modified vehicle transport system with an automatic balancing function so that vehicles among different vehicle transport systems can be interchanged automatically. In this situation, the amount of empty vehicles may be reduced down to a certain degree and a nearly maximum vehicle utilizing rate may be obtained.

SUMMARY OF THE INVENTION

To this and other objectives, the present invention provides an overhead rail guided transport system having an automatic balancing function and an implementation method thereof, which can improve the vehicle utilizing rate and reduce the amount of operating vehicles among the vehicle transport systems.

According to one embodiment, the present invention provides a method for implementing an overhead rail guided transport system, which comprises the following steps. A vehicle transport system comprising an upper rail guided transport system, a lower rail guided transport system, a vehicle exchange equipment and a plurality of vehicles operating in the upper rail guided transport system and the lower rail guided transport system are provided. Information about the upper vehicle utilizing rate of the upper rail guided transport system is provided. Information about the lower vehicle utilizing rate of the lower rail guided transport system is provided. The vehicle exchange equipment is utilized to exchange the vehicles between the upper and lower rail guided transport systems so that the upper and lower vehicle utilizing rates are equilibrated.

According to another embodiment, the present invention provides a vehicle transport system, which comprises the following components. An upper rail guided transport system, a lower rail guided transport system, a plurality of vehicles operating in the upper rail the lower rail guided transport systems, and a vehicle exchange system. A first controlling unit is used to monitor and record information about location, destination and vehicle utilizing rates of each of the vehicles in the upper rail guided transport system. A second controlling unit is used to monitor and record information about location, destination and vehicle utilizing rates of each of the vehicles in the lower rail guided transport system; a dispatch controlling unit is used to dispatch the vehicles and to control the vehicle exchange equipment. A main controlling system (MCS) is also used to control the first controlling unit, the second controlling unit and the dispatch controlling system, and to receive the information transmitted from the first and the second controlling unit.

Accordingly, the present invention provides a vehicle transport system with an automatic balancing function so that vehicles among different vehicle transport systems can be interchanged automatically, in real-time, without over consuming man power and time. In this situation, the amount of empty vehicles may be reduced down to a certain degree and a maximum vehicle utilizing rate may be approached.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
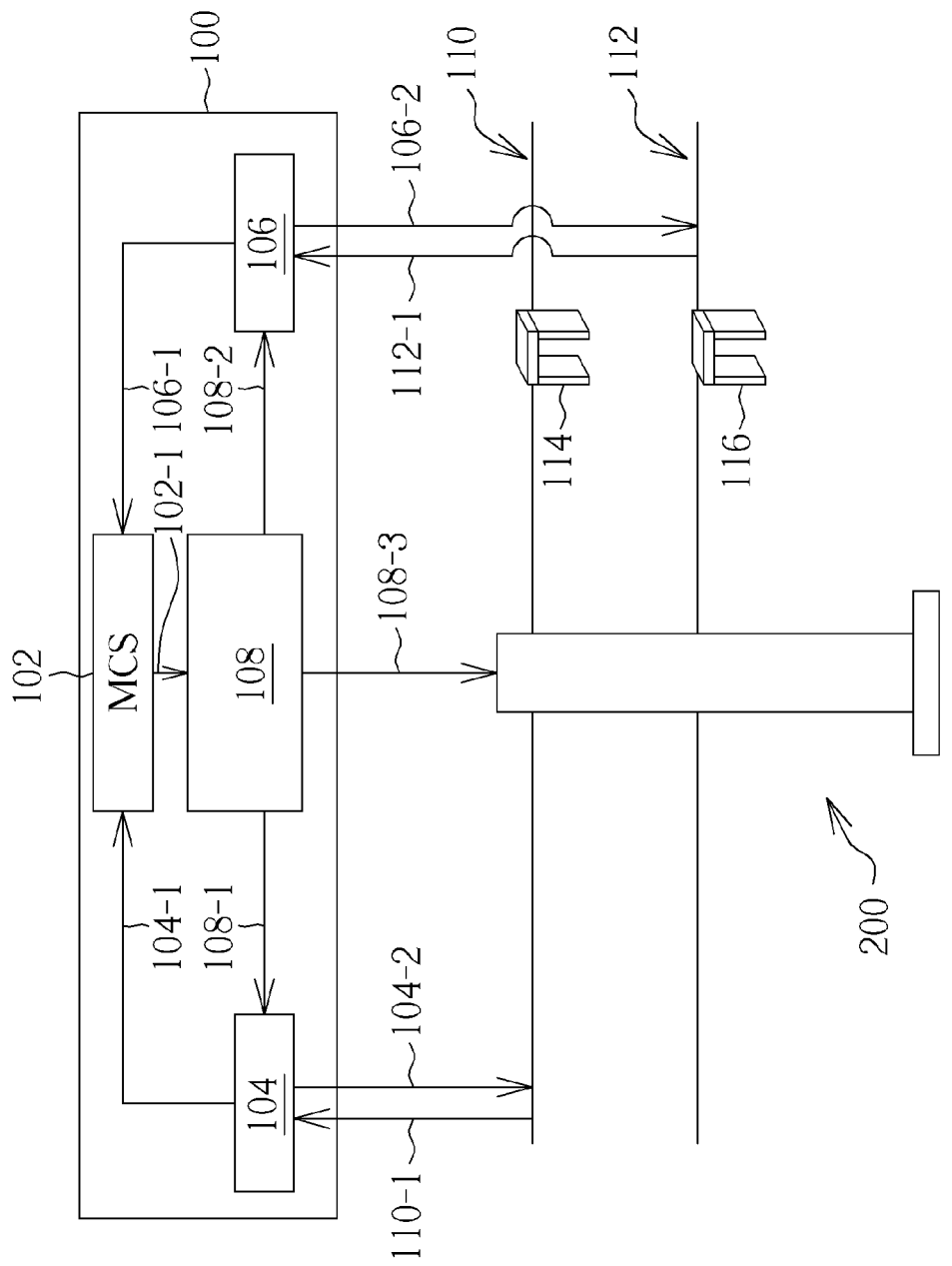
FIG. 1 is a block diagram illustrating an overhead rail guided transport system according to one embodiment of the invention.

FIG. 1 is a block diagram illustrating an overhead rail guided transport system according to one embodiment of the invention. As shown in FIG. 1, a vehicle transport system 100 is provided, which includes an upper rail guided transport system 110, a lower rail guided transport system 112, a vehicle exchange equipment 200, and a plurality of vehicles 114 and 116 operating in the upper and lower rail guided transport systems 110 and 112; a first controlling unit 104 is used to monitor and record information 110-1 about location, destination and vehicle utilizing rates of each of the vehicles 114 in the upper rail guided transport system 110; a second controlling unit 106 is used to monitor and record information 112-1 about location, destination and vehicle utilizing rates of each of the vehicles 116 in the lower rail guided transport system 112; a dispatch controlling unit 108 is used to provide dispatch signals 108-1 and 108-2 to the first controlling unit 104 and the second controlling unit 106 respectively and also to provide a signal 108-3 to control the vehicle exchange equipment 200; and a main controlling system 102 is used to control the first controlling unit 104, the second controlling unit 106 and the dispatch controlling unit 108 by receiving the information 104-1 and 106-1 transmitted from the first and the second controlling unit 104 and 106 respectively and transmitting a command signal 102-1 to the dispatch controlling unit 108, wherein the main controlling system may be a kind of material controlling system (MCS). In addition, after respectively receiving the dispatch signal 108-1 and 108-2, the first controlling unit 104 and the second controlling unit 106 may provide command signals 104-2 and 106-2 to order the vehicles 114 and 116 to move from or into the vehicle exchange equipment 200.

In the following paragraph, the implementation method of the above-described rail guided transport system will be described in detail. Numerous specific details are given to provide a thorough understanding of an operation related to the invention. It will, however, be apparent to one skilled in the art that the invention may be practiced without these specific details. Furthermore, some well-known system configurations and process steps are not disclosed in detail, as these should be well-known to those skilled in the art.

Likewise, the drawings showing the embodiments of the apparatus are not to scale and some dimensions are exaggerated for clarity of presentation. Also, when multiple embodiments are disclosed and described as having some features in common, like or similar features will usually be described with same reference numerals for ease of illustration and description thereof. In addition, in all of the specification, a term "includes" shall be construed as "comprises but not limited thereto"; a term "horizontal" is defined as a plane parallel to the conventional major plane or a surface of the semiconductor substrate, regardless of its orientation; a term "vertical" refers to a direction perpendicular to the horizontal plan just defined. Terms, such as "on", "above", "below", "bottom", "top", "side", "higher", "lower", "over" and "under", are defined relatively to the horizontal plane.

Figure 2:
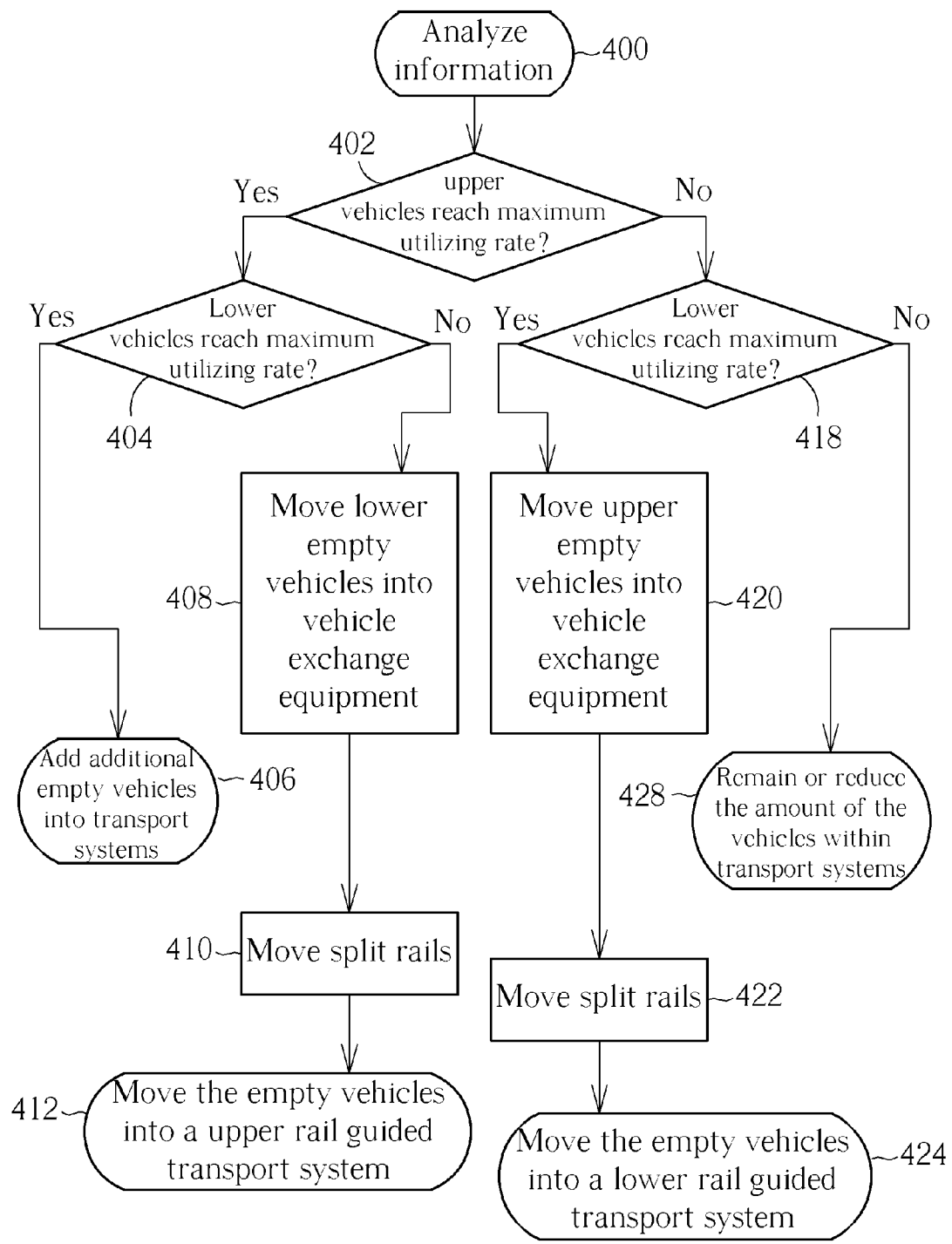
FIG. 2 is a flow chart showing an operation of an overhead rail guided transport system according to one embodiment of the invention.

Please refer to FIG. 2 accompanied with FIG. 1. FIG. 2 is a flow chart showing the operation of an overhead rail guided transport system according to one embodiment of the invention. In step 402, the main controlling system 102 receives signals 104-1 and 106-1 monitored by the first controlling unit 104 and second controlling unit 106, and further analyzes them. By analyzing the signals 104-1 and 106-1, the main controlling system 102 can calculate the vehicle utilizing rate related to each rail guided transport system respectively, which can be considered as the most important factor for determining whether the vehicles needs to be exchanged or not. It is worth noting that, the term "vehicle utilizing rate" throughout the specification should be interpreted as the average value of "(operation time of a vehicle in loaded state)/(total operation time of that vehicle in both empty and loaded state)". That is to say, if the vehicle utilizing rate is up to 100%, all vehicles 114 and 116 operating in the rail guided transport system are fully loaded. In contrast, if the vehicle utilizing rate is down to 0%, all vehicles 114 and 116 operating in the rail guided transport system are empty.

Please refer to step 402. Subsequently to step 400, the main controlling system 102 is going to determine whether the vehicle utilizing rate in the upper rail guided transport system 110 reaches or exceeds a maximum utilizing rate (preferably 80%, but is not limited thereto). If not, in step 418, it is determined whether the vehicle utilizing rate in the upper rail guided transport system 112 reaches or exceeds a maximum utilizing rate (preferably 80%, but is not limited thereto). If not, the execution flow proceeds to step 428, in which it is determined to diminish the amount of empty vehicle or maintain the amount of operating vehicles. In contrast, in step 418, if the vehicle utilizing rate in the upper rail guided transport system 112 has already reached or exceeded a maximum utilizing rate, steps 420 and 422 will be triggered. The detailed signal transmitting path related to steps 420 and 422 is described as follows. First, the main controlling system 102 transmits a command signal 102-1 to dispatch the controlling unit 108. In response, the dispatch controlling unit 108 will respectively provide dispatch signals 108-1 and 108-2 to the first controlling unit 104 and the second controlling unit 106 and provide a signal 108-3 to the control vehicle exchange equipment 200. Finally, in step 424, the second controlling unit 106 provides a command signal 106-2 to have at least one empty vehicle moved out of the vehicle exchange equipment 200 and then into the upper rail guided transport system 11.

Please still refer to FIG. 2. The preceding paragraph describes the steps when the vehicle utilizing rate in the upper rail guided transport system 110 is lower than the maximum utilizing rate. The situation where the vehicle utilizing rate in the upper rail guided transport system 110 reaches the maximum utilizing rate will be described in detail in the following paragraph. If step 402 result is positive, the execution flow proceeds to step 404, in which it is determined whether the vehicle utilizing rate in the upper rail guided transport system 112 reaches the maximum utilizing rate. If so, it means that too many loaded vehicles are operating in the upper rail guided transport system 110 and 112; therefore, as illustrated in step 406, additional empty vehicles should be supplied to the upper rail guided transport system 110 and 112 in order to reach a suitable utilizing rate. In contrast, in step 404, if the vehicle utilizing rate in the upper rail guided transport system 112 has not reached or exceeded a maximum utilizing rate yet, steps 408 and 410 will be triggered. Similarly, the detailed signal transmitting path related to steps 408 and 410 is like the path described in the previous paragraph. Finally, the execution flow proceeds to step 412, that is, the first controlling unit 104 provides a command signal 104-2 to have at least one empty vehicle moved out of the vehicle exchange equipment 200 and then into the upper rail guided transport system 110.

It should be noted that, in the preceding paragraph, each upper rail guided transport system 110 and each lower rail guided transport system 112 have their own "predetermined vehicle utilizing rate" (the predetermined vehicle utilizing rate may be set up as 70%, but it is not limited thereto). That is to say, if all of the vehicles 114 and 116 in the upper and lower rail guided transport systems 110 and 112 can be operated under the predetermined vehicle utilizing rate, the vehicles 114 and 116 perform the maximum transport efficiency and suffer from minimum operation damage. Therefore, the vehicle transport system 100 can be considered as a system having an automatic balancing function, which is able to automatically interchange the vehicles 114 and 116 between the upper and lower rail guided system 110 and 112 in real-time, without over consuming man power and time. As a result, the amount of empty vehicles in the rail guided systems can be reduced and the vehicles can be operated in an equilibrated situation.

FIGS. 3-6 are schematic diagrams showing an operation of a vehicle exchange equipment according to one embodiment of the present invention, which may also be accompanied with FIG. 1. A vehicle transport system 100 includes an upper rail guided transport system 110, a lower rail guided transport system 110, a vehicle exchange equipment 200 and a plurality of vehicles 114 and 116 operating in the upper and lower rail guided transport system 110 and the upper rail guided transport system 112 The vehicle exchange equipment 200 includes at least two split rails 220 and 230 and a support column 210 along a first direction Z, wherein the split rails 220 and 230 are respectively extending along the same direction of the upper rail 122 and of the lower rail 124, and can be moved along the first direction Z by a hoist system (not shown). That is to say, the split rails 220 and 230 are not fixed to the corresponding upper rail 122 and lower rail 124. It is worth noting that, since the split portion 126 is only exemplary, the split rails 220 and 230 are substantially firmly in contact with the respective upper rail 122 and lower rail 124 so that the stability of the vehicles 114 and 116 moving between the rail and the split rail can be well kept.

Figure 3:
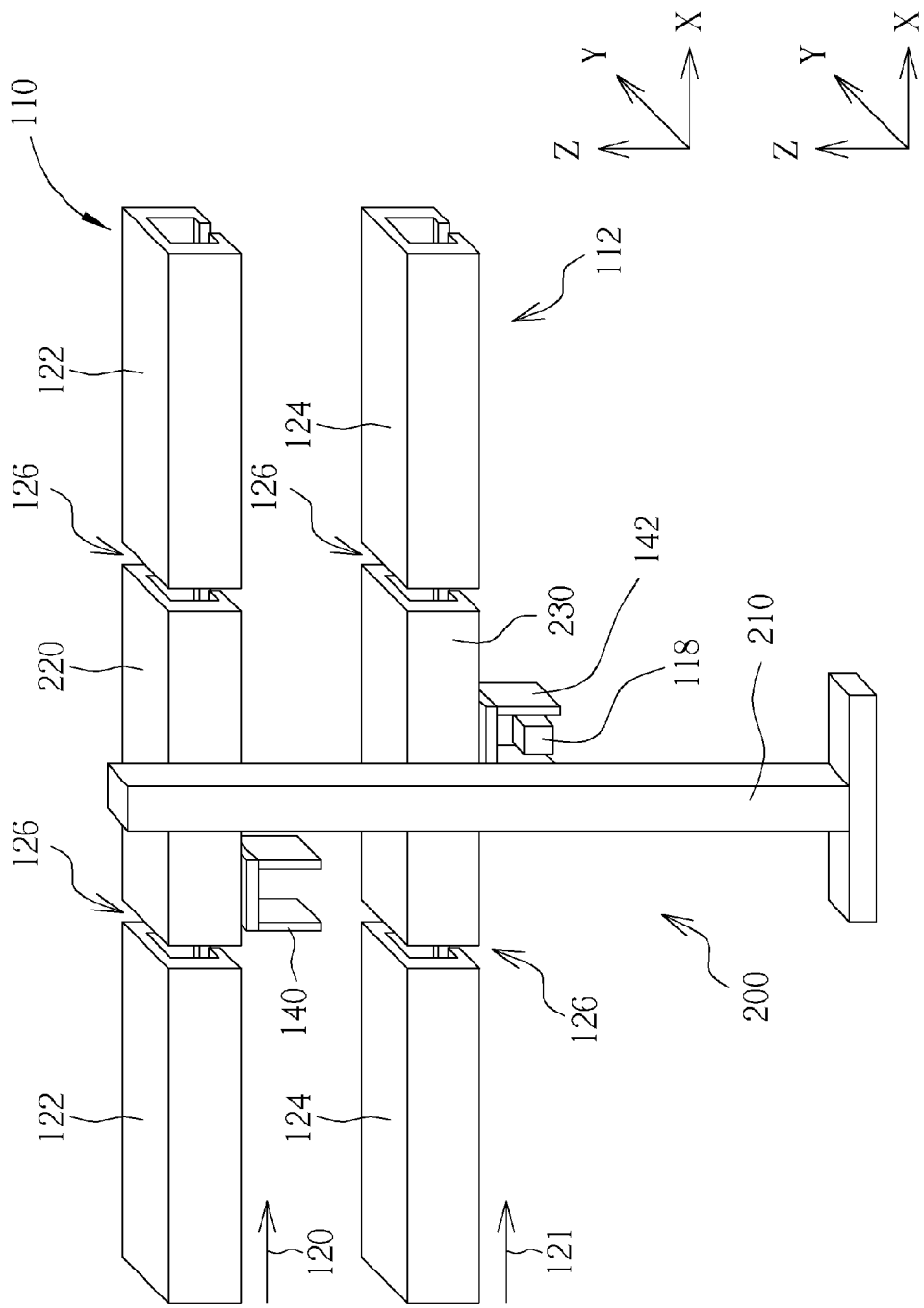
FIGS. 3-6 are schematic diagrams showing an operation of a vehicle exchange equipment according to one embodiment of the invention.
Figure 4:
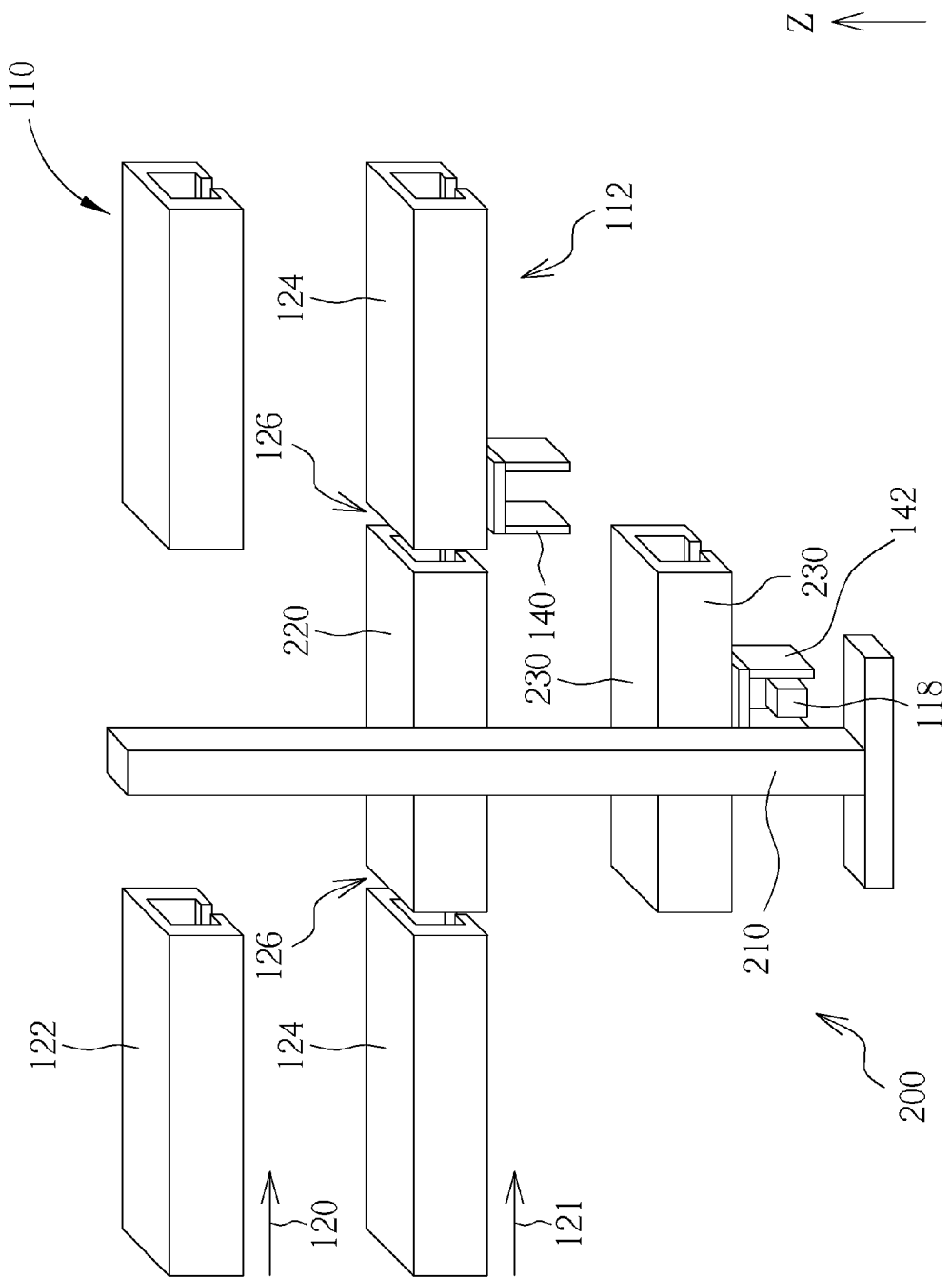

Please still refer to FIG. 3. In this embodiment, the vehicle utilizing rate in the upper rail guided transport system 112 has already reached or exceeded a maximum utilizing rate but the vehicle utilizing rate in the 110 has not reached the maximum utilizing rate yet. At this time, the dispatch controlling unit 108 provides a dispatch signal 108-1 to the first controlling unit 104 first. In response, the first controlling unit 104 provides a command signal 104-2 to move at least one empty vehicle 140 to the split rail 220 so that empty vehicle 140 may be moved in a space between the split rails 220 and 230. At the same time, a loaded vehicle 142, which carries at least one object 118, such as a front opening unified pod (FOUP) or a standard mechanical interface (SMIF), may or may not be present in the split rail 230. Subsequently, as shown in FIG. 4, the dispatch controlling unit 108 provides a signal 108-3 to the vehicle exchange equipment 200 so that the split rails 220 and 230 can be moved down along the first direction until the split rail 220 is substantially connected to the 124. At this time, the split rail 230 is not connected to any rail and may or may not include the loaded vehicle 142. Finally, the second controlling unit 106 provides a command signal 104-2 to have the empty vehicle 140 moved out of the split rail 220 and into the lower rail 124.

Figure 5:
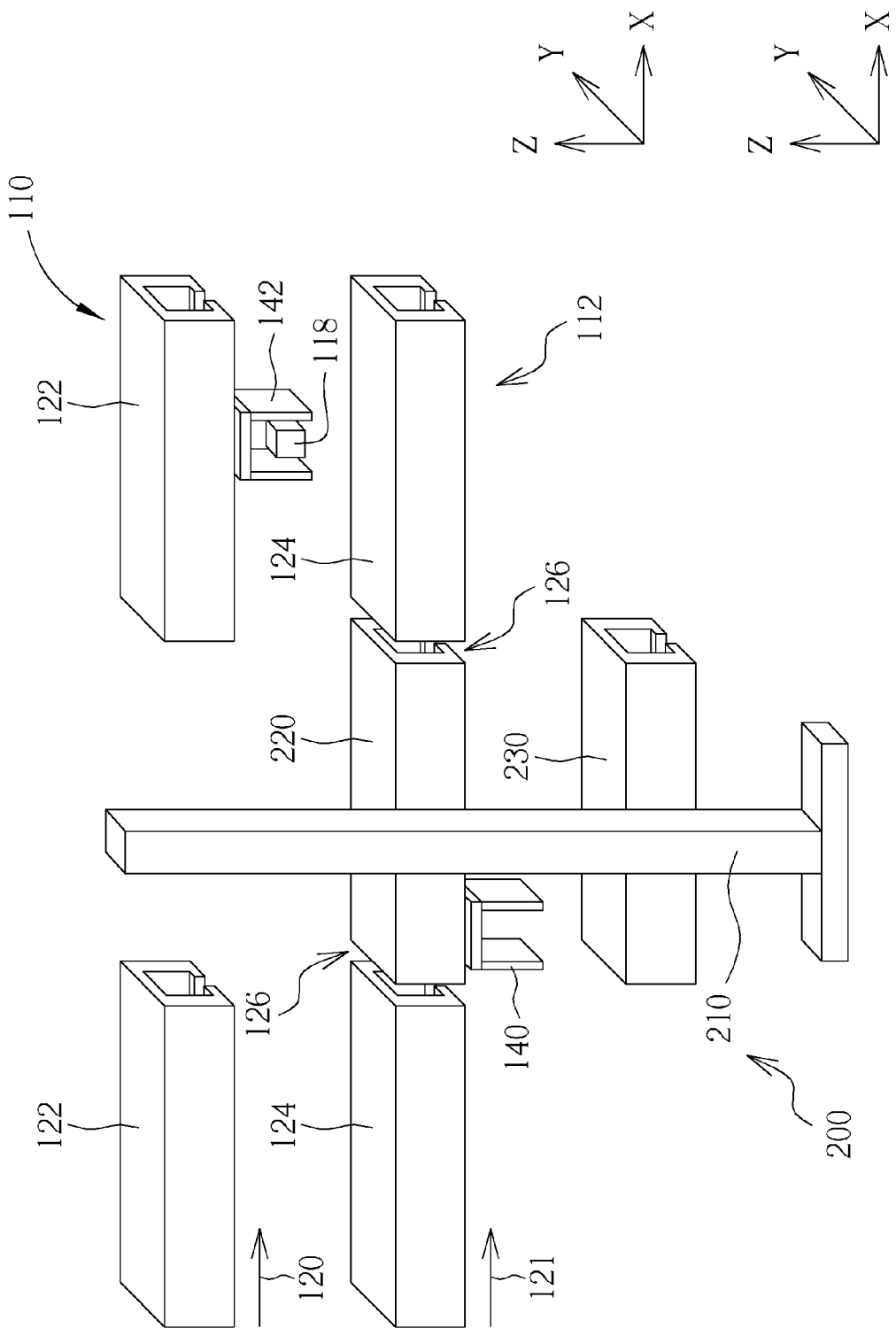
Figure 6:
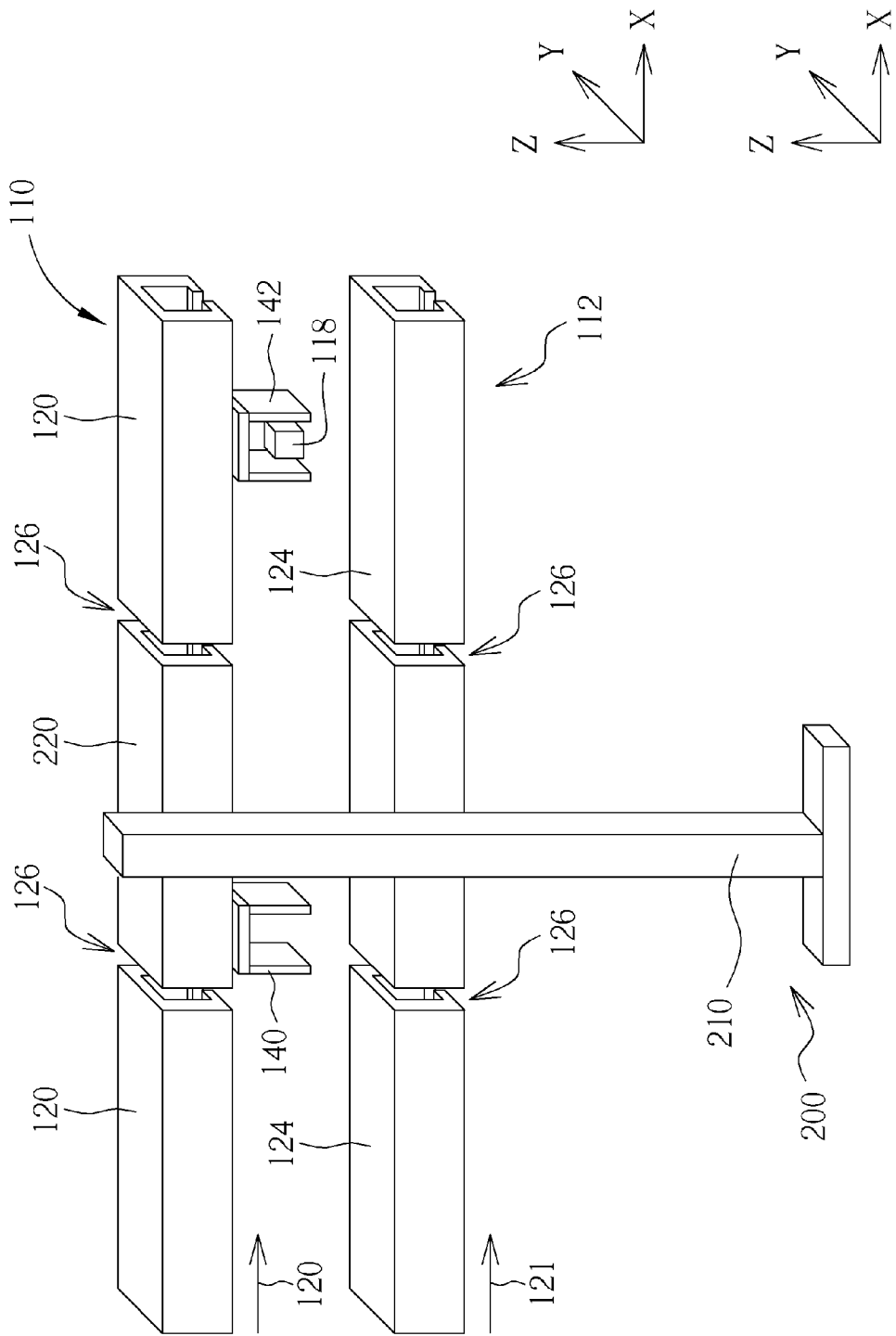

In the preceding embodiment, the vehicle utilizing rate in the upper rail guided transport system 112 has already reached or exceeded the maximum utilizing rate but the vehicle utilizing rate in the upper rail guided transport system 110 is still lower than the maximum utilizing rate. In the following paragraph, a situation, in which the vehicle utilizing rate in the upper rail guided transport system 110 has already reached or exceeded the maximum utilizing rate but the vehicle utilizing rate in the upper rail guided transport system 112 is still lower than the maximum utilizing rate will be described. Pleased refer to FIGS. 5 and 6, accompanied with FIG. 1. As shown in FIG. 5, since the vehicle utilizing rate in the upper rail guided transport system 110 has already reached or exceeded the maximum utilizing rate, that is, all of the vehicles 114 belong to the category of loaded vehicles 142, empty vehicles 140 in the lower rail guided transport system 112 should be moved into the upper rail guided transport system 110. The detailed operation mechanism is described as follows. At this time, the dispatch controlling unit 108 provides a signal 108-3 to the vehicle exchange equipment 200 so that the split rails 220 and 230 can be moved down along the first direction Z until the split rail 220 is substantially connected to the 124. Then, at least an empty vehicle 140 moves into the split rail 220. As shown in FIG. 6, the dispatch controlling unit 108 provides a signal 108-3 to the vehicle exchange equipment 200 so that the split rails 220 and 230 can be moved up until the split rail 220 is substantially connected to the 122 again. Finally, the first controlling unit 104 provides a command signal 104-2 to have the empty vehicle 140 moved out of the split rail 220 and into the upper rail 120.

Figure 7:
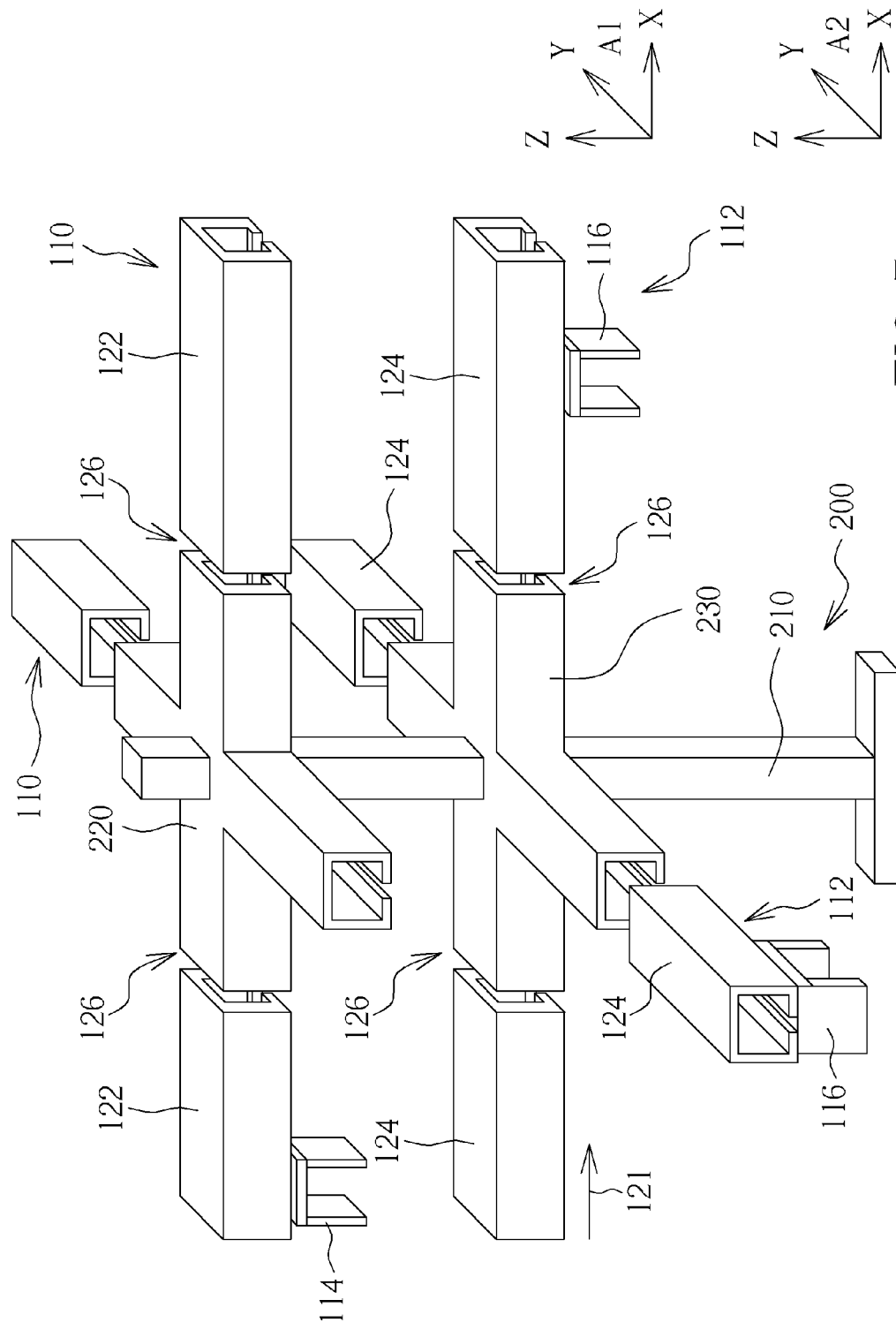
FIG. 7 is a 3-dimensional diagram showing a vehicle exchange equipment according to one embodiment of the invention.

In the above-mentioned embodiments, the split rails 220 and 230 attached to the support column 210 are extending along the same direction 120 and 121. According to another embodiment of the invention, however, the split rails 120 and 121 may extend along different direction simultaneously. As shown in FIG. 7, FIG. 7 is a 3-dimensional diagram showing vehicle exchange equipment according to one embodiment of the invention. The structure and the operation mechanism of the vehicle exchange equipment are like those shown in the FIGS. 3-6. In this embodiment, however, split rails 220 and 230, an upper rail 122 and a lower rail 124 are all extending along two directions, i.e. a second direction X and a third direction Y, wherein the second direction X is substantially arranged orthogonally to the third direction. Hence, each split rail 220 and 230 is approximately of a cross-shape and is firmly connected to the respective upper rail 122 and lower rail 124. For this reason, vehicles can move smoothly among the split rails 220 and 230 and the respective rails 122 and 124. The vehicle exchange equipment 200 also includes a support column 210 along the first direction Z, so that the split rails 220 and 230 can move up and down along the first direction Z. In this embodiment, the split rails 220 and 230 are located in a first plane A1 and a second plane A2 respectively, wherein both of the planes A1 and A2 are orthogonal to the first direction Z.

In Summary, the present invention provides a modified vehicle transport system 100 and a vehicle exchange equipment 200, in which vehicles 114 and 116 may be automatically exchanged between the upper and lower rail guided systems 110 and 112 in real-time without over consuming man power and time. In addition, since the vehicle transport system 100 has an automatic balancing function, the amount of empty vehicles operating in the rail guided systems 110 and 112 can be reduced and the vehicles 114 and 116 can be operated in an equilibrated situation.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for implementing an overhead rail guided transport system, comprising:
   providing a vehicle transport system comprising an upper rail guided transport system, a lower rail guided transport system, a vehicle exchange equipment and a plurality of vehicles operating in the vehicle transport system, wherein the vehicle exchange equipment comprises two split rails and a support column, wherein the support column is along a first direction and is connected to the two split rails and at least one of the vehicles moves in a space between the split rails;
   providing information about the upper vehicle utilizing rate to the main controlling system;
   providing information about the lower vehicle utilizing rate by to the main controlling system; and
   utilizing the vehicle exchange equipment and moving the split rails up and down along the support column according to the information about the upper vehicle utilizing rate and the lower vehicle utilizing rate to exchange the vehicles between the upper and lower rail guided transport systems until the upper and lower vehicle utilizing rates are equilibrated, wherein a step for utilizing the vehicle exchange equipment comprises:
   moving the vehicles to the split rails;
   moving the split rails loaded with the vehicles along a first direction; and
   moving the vehicles out of the split rails.

2. The method according to claim 1, wherein the vehicle transport system further comprises:
- a first controlling system used to monitor and record information about location, destination and vehicle utilizing rates of each of the vehicles in the upper rail guided transport system;
- a second controlling system used to monitor and record information about location, destination and vehicle utilizing rates of each of the vehicles in the lower rail guided transport system;
- a dispatch controlling system used to dispatch the vehicles and control the vehicle exchange equipment; and
- the main controlling system (MCS) used to control the first controlling system, the second controlling system and the dispatch controlling system and receive the information transmitted from the first controlling system and the second controlling system.

3. The method according to claim 2, further comprising a step of:
- when the upper vehicle utilizing rate reaches a maximum utilizing rate, the MCS commands the dispatch controlling system to dispatch at least one empty vehicle from the lower rail guided transport system into the upper rail guided transport system through the vehicle exchange equipment.

4. The method according to claim 2, further comprising a step of:
- when the lower vehicle utilizing rate reaches a maximum utilizing rate, the MCS commands the dispatch controlling system to dispatch at least one empty vehicle from the upper rail guided transport system into the lower rail guided transport system through the vehicle exchange equipment.

5. A vehicle transport system, comprising:
- an upper rail guided transport system, a lower rail guided transport system, a plurality of vehicles operating in the upper rail and the lower rail guided transport systems, and a vehicle exchange system, wherein the vehicle exchange system comprises two split rails and a support column, wherein the support column is along a first direction and is connected to the two split rails and the split rails alternatively connect to either the upper rail guided transport system and the lower rail guided transport system, at least one of the vehicles moves in a space between the split rails;
- a first controlling unit used to monitor and record information about location, destination and vehicle utilizing rates of each of the vehicles in the upper rail guided transport system;
- a second controlling unit used to monitor and record information about location, destination and vehicle utilizing rates of each of the vehicles in the lower rail guided transport system;
- a dispatch controlling unit used to dispatch the vehicles and move the split rails up and down along the support column according to the information about the upper vehicle utilizing rates and the lower vehicle utilizing rates; and
- a main controlling system (MCS) used to control the first controlling unit, the second controlling unit and the dispatch controlling system and receive the information transmitted from the first and the second controlling unit.

6. The vehicle transport system according to claim 5, wherein the split rails are respectively located in at least a first plane and a second plane and both of the first plane and the second plane are substantially perpendicular to the first direction.

7. The vehicle transport system according to claim 5, wherein the split rails are extending along a second direction and a third direction substantially perpendicular to the second direction.

8. The vehicle transport system according to claim 5, wherein the split rails are extending along a same direction.

9. The vehicle transport system according to claim 5, wherein each of the split rails is not connected to the upper rail guided transport system and the lower rail guided transport system simultaneously.

10. The vehicle transport system according to claim 5, wherein the vehicle exchange equipment further comprises a hoist system to drive the split rails along the first direction.

11. The vehicle transport system according to claim 5, wherein vehicle is used to carry at least one object.

12. The vehicle transport system according to claim 11, wherein the object comprises a front opening unified pod (FOUP) or a standard mechanical interface (SMIF).

13. A vehicle transport system, comprising:
- an upper rail guided transport system, a lower rail guided transport system, and a plurality of vehicles operating in the upper rail and the lower rail guided transport systems;
- a vehicle exchange system comprising two split rails and a support column, wherein the split rails are movably disposed on the support column in opposite directions, and the split rails alternatively connect to either of the upper rail guided transport system and the lower rail guided transport system, at least one of the vehicles moves in a space between the rails;
- a first controlling unit used to monitor and record information about location, destination and vehicle utilizing rates of each of the vehicles in the upper rail guided transport system;
- a second controlling unit used to monitor and record information about location, destination and vehicle utilizing rates of each of the vehicles in the lower rail guided transport system;
- a dispatch controlling unit used to dispatch the vehicles and control the vehicle exchange equipment according to the information about the upper vehicle utilizing rates and the lower vehicle utilizing rates; and
- a main controlling system (MCS) used to control the first controlling unit, the second controlling unit and the dispatch controlling system and receive the information transmitted from the first and the second controlling unit.

14. The vehicle transport system according to claim 13, wherein the support column is along a first direction and is connected to the two split rails.

15. The vehicle transport system according to claim 14, wherein the vehicle exchange equipment further comprises a hoist system to drive the split rails along the first direction.

16. The vehicle transport system according to claim 13, wherein the split rails are extending along a same direction.

17. The vehicle transport system according to claim 13, wherein the vehicle is used to carry at least one object.

18. The vehicle transport system according to claim 17, wherein the object is a front opening unified pod (FOUP) or a standard mechanical interface (SMIF).

* * * * *